(12) United States Patent
Sakata et al.

(10) Patent No.: US 7,173,322 B2
(45) Date of Patent: *Feb. 6, 2007

(54) COF FLEXIBLE PRINTED WIRING BOARD AND METHOD OF PRODUCING THE WIRING BOARD

(75) Inventors: Ken Sakata, Shimonoseki (JP); Katsuhiko Hayashi, Ageo (JP)

(73) Assignee: Mitsui Mining & Smelting Co., Ltd., Tokyo ( * ) Notice: Subject to any disclaimer, the term of this patent is extended or adjusted under 35 U.S.C. 154(b) by 0 days.

This patent is subject to a terminal disclaimer.

(21) Appl. No.: 10/386,116

(22) Filed: Mar. 12, 2003

(65) Prior Publication Data

US 2004/0004823 A1    Jan. 8, 2004

(30) Foreign Application Priority Data

| Mar. 13, 2002 | (JP) | ............................. 2002-068500 |
| Nov. 1, 2002 | (JP) | ............................. 2002-319297 |
| Nov. 5, 2002 | (JP) | ............................. 2002-321853 |
| Dec. 10, 2002 | (JP) | ............................. 2002-358565 |

(51) Int. Cl.
*H01L 23/02* (2006.01)

(52) U.S. Cl. ...................... 257/678; 257/713; 257/703; 257/791; 257/792; 257/778; 257/737; 257/706; 257/668; 361/749

(58) Field of Classification Search ................ 257/678, 257/713, 703, 791, 792, 778, 737, 706, 668; 361/749

See application file for complete search history.

(56) References Cited

U.S. PATENT DOCUMENTS

| 3,503,782 A | 3/1970 | Ayres |
| 3,554,835 A | 1/1971 | Morgan |
| 5,073,422 A | 12/1991 | Konno et al. |
| 5,082,706 A | 1/1992 | Tangney |
| 5,273,805 A | 12/1993 | Calhoun et al. |
| 5,281,455 A | 1/1994 | Braun et al. |
| 5,759,455 A | 6/1998 | Kamitakahara et al. |
| 5,965,226 A | 10/1999 | Muschelewicz et al. |
| 6,210,767 B1 | 4/2001 | Knauf |
| 6,280,831 B1 | 8/2001 | Nakanishi et al. |
| 6,280,851 B1 | 8/2001 | Pasternack et al. |
| 6,320,135 B1 | 11/2001 | Saito |

(Continued)

FOREIGN PATENT DOCUMENTS

JP     61-050394 A     3/1986

(Continued)

*Primary Examiner*—Eddie C. Lee
*Assistant Examiner*—Junghwa Im
(74) *Attorney, Agent, or Firm*—Sughrue Mion, PLLC (57) ABSTRACT

The present invention provides a COF flexible printed wiring board whose insulating layer is not melt-adhered to a heating tool, to thereby enhance reliability and productivity of a semiconductor chip mounting line, and also provides a method of producing the COF flexible printed wiring board. The COF flexible printed wiring board contains an insulating layer, a wiring pattern, on which a semiconductor chip being mounted, formed of a conductor layer provided on at least one side of the insulating layer and a releasing layer, wherein the releasing layer is formed from a releasing agent containing at least one species selected from a silane compound and silica sol and is provided on a surface of the insulating layer, which is opposite to the mounting side of the semiconductor chip.

9 Claims, 5 Drawing Sheets

U.S. PATENT DOCUMENTS

| | | |
|---|---|---|
| 6,441,474 B2 | 8/2002 | Naitoh et al. |
| 6,458,234 B1 | 10/2002 | Lake et al. |
| 6,521,309 B1 | 2/2003 | Chen et al. |
| 6,548,234 B2 | 4/2003 | Gibson |
| 6,572,780 B2 * | 6/2003 | McCormack et al. ......... 216/13 |
| 6,605,369 B1 | 8/2003 | Takahashi et al. |
| 6,613,987 B2 | 9/2003 | Seki et al. |
| 6,617,521 B1 | 9/2003 | Saito et al. |
| 6,624,520 B1 | 9/2003 | Nakamura |
| 6,761,948 B2 | 7/2004 | Schwinn |
| 6,794,031 B2 | 9/2004 | Murakami et al. |
| 6,476,330 B2 * | 5/2005 | Sakata ................... 174/261 |
| 6,900,989 B2 * | 5/2005 | Sakata ................... 361/749 |
| 6,911,729 B1 | 6/2005 | Chikawa |
| 2003/0038379 A1 | 2/2003 | Kawasaki et al. |
| 2003/0091842 A1 | 5/2003 | Murakami et al. |
| 2003/0145949 A1 | 8/2003 | Tanaka et al. |
| 2005/0205972 A1 | 9/2005 | Sakata et al. |

FOREIGN PATENT DOCUMENTS

| | | |
|---|---|---|
| JP | 61-158153 A | 7/1986 |
| JP | 03-138392 | 6/1991 |
| JP | 03-157414 A | 7/1991 |
| JP | 05-315401 A | 11/1993 |
| JP | 09-055402 | 2/1997 |
| JP | 09-115961 A | 5/1997 |
| JP | 09-289232 A | 11/1997 |
| JP | 10-151408 A | 6/1998 |
| JP | 2000-138264 A | 5/2000 |
| JP | 2000-353726 | 12/2000 |
| JP | 2001-094232 | 4/2001 |
| JP | 2001-127119 | 5/2001 |
| JP | 2001-210676 A | 8/2001 |
| JP | 2001-291739 | 10/2001 |
| JP | 2001-351950 A | 12/2001 |
| JP | 2002-009108 A | 1/2002 |
| JP | 2002-252257 | 9/2002 |
| JP | 2002-289651 | 10/2002 |
| JP | 2003-338528 A | 11/2003 |
| JP | 2004-207669 A | 7/2004 |
| JP | 2004-207670 A | 7/2004 |
| JP | 2004-207671 A | 7/2004 |

* cited by examiner

COF FLEXIBLE PRINTED WIRING BOARD AND METHOD OF PRODUCING THE WIRING BOARD

BACKGROUND OF THE INVENTION

1. Field of the Invention

The present invention relates to a COF (chip-on-film) flexible printed wiring board; e.g., a COF film carrier tape or a COF flexible printed circuit (FPC), for mounting electronic devices such as ICs and LSIs thereon. The invention also relates to a method of producing the COF flexible printed wiring board. The term "COF flexible printed wiring board" refers to a flexible printed wiring board onto which electronic devices (chips) are to be mounted. The term "COF film carrier tape" refers to a film substrate assuming the form of tape onto which electronic devices (chips) are to be mounted.

2. Description of the Related Art

Development of the electronics industry has been accompanied by sharp demand for printed-circuit boards for mounting electronic devices thereon, such as ICs (Integrated Circuits) and LSIs (Large-Scale Integrated circuits). Manufacturers have attempted to realize small-size, lightweight, and high-function electronic equipment, which has long been desired. To this end, manufactures have recently come to employ a film carrier tape, such as a TAB (tape automated bonding) tape, a T-BGA (ball grid array) tape, an ASIC tape, or an FPC (flexible printed circuit). Use of film carrier tapes for mounting electronic devices thereon has become of increasing importance, especially for manufacturers of personal computers, cellular phones, and other electronic equipment employing a liquid crystal display (LCD) that must have high resolution and flatness, as well as a narrow screen-frame area.

In addition, in order to attain higher-density mounting on a narrower space, mounting of bare IC chips directly on a flexible printed wiring board has been employed. Such a product is called COF (chip-on-film).

Since the flexible printed wiring board serving as a substrate of COFs does not have a device hole, a laminate film obtained by laminating in advance a conductor layer and an insulating layer is employed as the flexible printed wiring board. When IC chips are directly mounted on the wiring pattern, positioning is performed on the basis of marks such as an inner lead and a positioning mark which are visible through the insulating layer, followed by joining the IC chips and the wiring pattern; i.e., the inner lead, by means of a heating tool (see, for example, Japanese Patent Application Laid-Open (kokai) No. 2002-289651, FIGS. 4 to 6 and paragraphs [0004] and [0005]).

Such semiconductor chips are mounted while the insulating layer is in direct contact with a heating tool. Since the insulating layer is heated to a considerably high temperature by the heating tool during mounting, a portion of the insulating layer is caused to adhere to the heating tool by melting, thereby causing stoppage of a production apparatus. In addition, unfavorable deformation of the carrier tape occurs. In the case where the insulating layer is melt-adhered to the heating tool, the heating tool is stained, thereby deteriorating reliability and productivity.

Such melt adhesion to the heating tool is critical when semiconductor chips are mounted on a COF film carrier tape or a COF FPC having no device hole.

SUMMARY OF THE INVENTION

In view of the foregoing, an object of the present invention is to provide a COF flexible printed wiring board whose insulating layer is not melt-adhered to a heating tool, to thereby enhance reliability and productivity of a semiconductor chip mounting line. Another object of the invention is to provide a method of producing the COF flexible printed wiring board.

Accordingly, in a first aspect of the present invention, there is provided a COF flexible printed wiring board comprising: an insulating layer; a wiring pattern, on which a semiconductor chip being to be mounted, formed of a conductor layer provided on at least one side of the insulating layer and a releasing layer, wherein the releasing layer is formed from a releasing agent containing at least one species selected from a silane compound and silica sol and is provided on a surface of the insulating layer, which is opposite to the mounting side of the semiconductor chip.

Through employment of the COF flexible printed wiring board according to the first aspect, the releasing layer is brought into direct contact with a heating tool during mounting of semiconductor chips. Thus, melt adhesion between the layer and the heating tool does not occur, thereby preventing staining of the heating tool caused by melt adhesion of the insulating layer.

In the second aspect of the present invention, the releasing layer may be formed from a releasing agent containing a silazane compound.

Through employment of the above construction according to the second aspect, the releasing layer is formed from a silicone series releasing containing a silazane compound (i.e., a type of silane compound), melt adhesion can be reliably prevented.

In the third aspect of the present invention, the releasing layer may be formed by coating a solution containing the releasing agent to the insulating layer and heating.

Through employment of the above construction according to the third aspect, the above releasing layer is formed through the coating method, melt adhesion can be reliably prevented.

In the forth aspect of the present invention, the releasing layer may be formed by transferring the releasing layer provided on a transfer film substrate.

Through employment of the above construction according to the forth aspect, the above releasing layer can be readily formed through the transfer method.

In the fifth aspect of the present invention, the insulating layer may be formed by coating a solution containing a polyimide precursor resin to the conductor layer, drying the solution, and curing the resin.

Through employment of the above construction according to the fifth aspect, the insulating layer is formed in the above manner, a COF flexible printed wiring board having an insulating layer formed of polyimide can be obtained.

In the sixth aspect of the present invention, the insulating layer may comprise a layer structure including an insulating film and a thermoplastic resin layer, wherein the structure is hot-press-adhered to the conductor layer.

Through employment of the above embodiment according to the sixth aspect, the insulating layer is formed, on the conductor layer, from a thermoplastic resin layer and an insulating film.

In the seventh aspect of the present invention, the insulating layer may comprise a layer structure including an insulating film and a thermosetting resin layer, wherein the structure is hot-press-adhered to the conductor layer.

Through employment of the above embodiment according to the seventh aspect, the insulating layer is formed, on the conductor layer, from a thermosetting resin layer and an insulating film.

In the eighth aspect of the present invention, the conductor layer may comprise a bond-improving layer sputtered on the insulating layer, and a copper plating layer provided on the bond-improving layer.

Through employment of this procedure according to the eighth aspect, the conductor layer is formed, on the insulating layer, from a bond-improving layer (e.g., nickel) and a copper plating layer.

In the ninth aspect of the present invention, there is provided a method of producing a COF flexible printed wiring board including an insulating layer and a wiring pattern, on which a semiconductor chip being to be mounted, formed through photolithography of a conductor layer provided on at least one side of the insulating layer, comprising: patterning the conductor layer through photolithography, to thereby form the wiring pattern; and, subsequently, forming a releasing layer on a surface of the insulating layer, which surface is opposite to the mounting side of the semiconductor chip.

Through employment of the method of producing a COF flexible printed wiring board according to the ninth aspect, the releasing layer, which is firmly formed after completion of photolithography, is brought into contact with a heating tool during mounting of semiconductor chips. Thus, adhesion of the releasing layer to the heating tool does not occur, thereby preventing staining of the heating tool caused by melt adhesion of the insulating layer.

In the tenth aspect of the present invention, the releasing layer may comprise a silicone series compound.

Through employment of the method according to the tenth aspect, the releasing agent, which is to be in contact with a heating tool, is a silicone series releasing agent, melt adhesion or a similar phenomenon can be reliably prevented.

In the eleventh aspect of the present invention, the releasing layer may be formed from a releasing agent containing at least one species selected from among a siloxane compound, a silane compound, and a silica sol.

Through employment of the method according to the eleventh aspect, the releasing layer, which is to be in contact with a heating tool, is formed from a releasing agent comprising a siloxane compound, a silane compound, or silica sol, melt adhesion or a similar phenomenon can be reliably prevented.

In the twelfth aspect of the present invention, the formation of a releasing layer may comprise coating a solution containing a releasing agent and heating.

Through employment of this procedure according to the twelfth aspect, the releasing layer is formed by coating the releasing agent and optionally heating.

In the thirteenth aspect of the present invention, the formation of a releasing layer may be performed at any timing after removal of a resist mask employed for forming the wiring pattern.

Through employment of this procedure according to the thirteenth aspect, the releasing layer is formed after the photolithographic process. Thus, the releasing layer is not dissolved by a photoresist remover or similar liquid, thereby attaining an effective releasing effect.

In the fourteenth aspect of the present invention, the insulating layer may be formed by coating a solution containing a polyimide precursor resin to the conductor layer, drying the solution, and curing the resin.

Through employment of the above embodiment according to the fourteenth aspect, a COF flexible printed wiring board having an insulating layer formed of polyimide can be provided.

In the fifteenth aspect of the present invention, the insulating layer may comprise a layer structure including an insulating film and a thermoplastic resin layer, wherein the structure is hot-press-adhered to the conductor layer.

Through employment of the above embodiment according to the fifteenth aspect, the insulating layer is formed, on the conductor layer, from a thermoplastic resin layer and an insulating film.

In the sixteenth aspect of the present invention, the insulating layer may comprise a layer structure including an insulating film and a thermosetting resin layer, wherein the structure is hot-press-adhered to the conductor layer.

Through employment of the above embodiment according to the sixteenth aspect, the insulating layer is formed, on the conductor layer, from a thermosetting resin layer and an insulating film.

In the seventeenth aspect of the present invention, the conductor layer may comprise a bond-improving layer sputtered on the insulating layer, and a copper plating layer provided on the bond-improving layer.

Through employment of the above embodiment according to the seventeenth aspect, the conductor layer is formed, on the insulating layer, from a bond-improving layer (e.g., nickel) and a copper plating layer.

In the eighteenth aspect of the present invention, there is provided a method of producing a COF flexible printed wiring board including a insulating layer and a wiring pattern, on which a semiconductor chip being to be mounted, formed of a conductor layer provided on at least one side of the insulating layer comprising: patterning the conductor layer, to thereby form the wiring pattern; and transferring the releasing layer formed on a film substrate for transferring to a surface of the insulating layer, which surface is opposite to the mounting side of the semiconductor chip.

Through employment of the method of producing a COF flexible printed wiring board according to the eighteenth aspect, the releasing layer is comparatively readily formed through the transfer process and is brought into contact with a heating tool during mounting of semiconductor chips. Thus, adhesion of the releasing layer to the heating tool or stage does not occur, thereby preventing staining of the heating tool caused by melt adhesion of the insulating layer.

In the nineteenth aspect of the present invention, the releasing layer may comprise a silicone series compound.

Through employment of the method according to the nineteenth aspect, after the releasing layer, which is to be in contact with a heating tool, comprises a silicone series compound, melt adhesion or a similar phenomenon can be reliably prevented.

In the twentieth aspect of the present invention, the releasing layer may be formed from a releasing agent containing at least one species selected from among a siloxane compound, a silane compound, and silica sol.

Through employment of the method according to the twentieth aspect, the releasing layer, which is to be in contact with a heating tool, is formed from a releasing containing a siloxane compound, a silane compound, or silica sol, melt adhesion or a similar phenomenon can be reliably prevented.

In the twenty-first aspect of the present invention, the insulating layer may be formed by coating a solution containing a polyimide precursor resin to the conductor layer, drying the solution, and curing the resin.

Through employment of the above embodiment according to the twenty-first aspect, a COF flexible printed wiring board having an insulating layer formed of polyimide can be provided.

In the twenty-second aspect of the present invention, the insulating layer may comprise a layer structure including an insulating film and a thermoplastic resin layer, wherein the structure is hot-press-adhered to the conductor layer.

Through employment of the above embodiment according to the twenty-second aspect, the insulating layer is formed, on the conductor layer, from a thermoplastic resin layer and an insulating film.

In the twenty-third aspect of the present invention, the insulating layer may have a layer structure including an insulating film and a thermosetting resin layer, wherein the structure is hot-press-adhered to the conductor layer.

Through employment of the above embodiment according to the twenty-third aspect, the insulating layer is formed, on the conductor layer, from a thermosetting resin layer and an insulating film.

In the twenty-forth aspect of the present invention, the conductor layer may comprise a bond-improving layer sputtered on the insulating layer, and a copper plating layer provided on the bond-improving layer.

Through employment of the method according to the twenty-forth aspect, the copper plating layer which is provided on the insulating layer serves as a conductor layer.

As described hereinabove, the COF flexible printed wiring board (e.g., COF film carrier tape or COF FPC) of the present invention has a specific silicone series releasing layer. Therefore, melt adhesion of the insulating layer of the film carrier tape to a heating tool is prevented during mounting of semiconductor chips, to thereby enhance reliability and productivity of a semiconductor chip mounting line.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with accompanying drawings, in which.

DETAILED DESCRIPTION OF PREFERRED EMBODIMENTS

The COF flexible printed wiring board (e.g., a COF film carrier tape or a COF FPC) of the present invention comprises a conductor layer and an insulating layer. No particular limitation is imposed on the laminate film comprising a conductor layer and an insulating layer and used in the COF flexible printed wiring board, and any type of conductor-insulator laminate film can be employed. Examples of such laminate film include a laminate film prepared by sputtering a bond-improving layer (e.g., Ni) on an insulating film (e.g., polyimide film) and plating copper on the bond-improving layer; a casting-type laminate film prepared by coating polyimide to copper foil; and a laminate film prepared through hot-press-adhesion of an insulating film onto copper foil through a thermoplastic or thermosetting resin.

The COF flexible printed wiring board of the present invention or the COF flexible printed wiring board produced through the method of the present invention comprises the aforementioned laminate film and a releasing layer which is provided on the insulating layer of the laminate film opposing the conductor layer. In the production method of the present invention, no particular limitation is imposed on the material for forming the releasing layer, so long as the material has such releasability that adhesion of the laminate film to a heating tool during mounting of semiconductor chips is prevented and does not induce melt adhesion by heat. Both inorganic and organic materials are employable. Examples of preferred releasing agents include a silicone series releasing agent, an epoxy series releasing agent, or a fluorine-containing compound, more preferably a silicone series compound; i.e., a compound having a siloxane bond (Si—O—Si). A releasing layer comprising a silicone series compound is preferred, since the layer can be formed in a relatively simple manner and does not tend to adversely affect adhesion of mold resin even when the releasing layer is transferred to a mount side of the produced printed wiring board.

Examples of the releasing agents for forming a releasing layer comprising a silicone series compound; i.e., a compound having a siloxane bond, include silicone series releasing agents.

More specifically, such releasing agents contain at least one species selected from among siloxane compounds such as disiloxane and trisiloxane. Preferably, the releasing agent comprises a compound which transforms into a silicone series compound through application and reaction of the releasing agent. Examples of such compounds include silane compounds such as monosilane, disilane, and trisilane; and silica sol series compounds.

Examples of more preferred releasing agents include releasing agent containing an alkoxysilane compound, or a silazane compound such as hexamethyldisilazane or perhydropolysilazane, which belongs to silane compounds having a Si—NH—Si structure serving as a precursor for forming a siloxane bond. These releasing agents form a releasing layer comprising a compound having a siloxane bond through application thereof or reaction with moisture or a similar substance contained in air after the application. However, for example, in case silazane compound is used, unreacted Si—NH—Si may also be present in the releasing layer.

As described above, the most preferred releasing layer is formed of the silicone series compound formed by reaction after the application.

Although the above releasing agents generally contain an organic solvent, similar releasing agents of aqueous solution type or emulsion form may also be employed.

Specific examples of the releasing agents include silicone series resin SR 2411 (trade name: product of Dow Corning Toray Silicone Co., Ltd., containing dimethylsiloxane-series silicone series oil, methyltri(methyl ethyl ketoxime)silane, toluene, and ligroin); silicone series resin SEPA-COAT (trade name: product of Shin-Etsu Chemical Co., Ltd., containing silazane, synthetic isoparaffin, and ethyl acetate); and COLCOAT SP-2014S (trade name: product of Colcoat Co., Ltd., containing a silane compound). Examples of releasing agents containing silica sol include COLCOAT P and COLCOAT N-103X (trade names: products of Colcoat Co., Ltd.). A grain size of silica contained in silica sol is, for example, 50 to 80 Å (angstrom).

Notably, provision of a releasing layer formed of a silicone series releasing agent containing a silazane compound is particularly preferred, since the releasing agent has excellent releasability for preventing adhesion of the laminate film to a heating tool during mounting of semiconductor chips and does not induce melt adhesion by heat. Examples of such releasing agents containing a silazane compound include silicone series resin SEPA-COAT (trade name: product of Shin-Etsu Chemical Co., Ltd., containing silazane, synthetic isoparaffin, and ethyl acetate).

Figure 5:
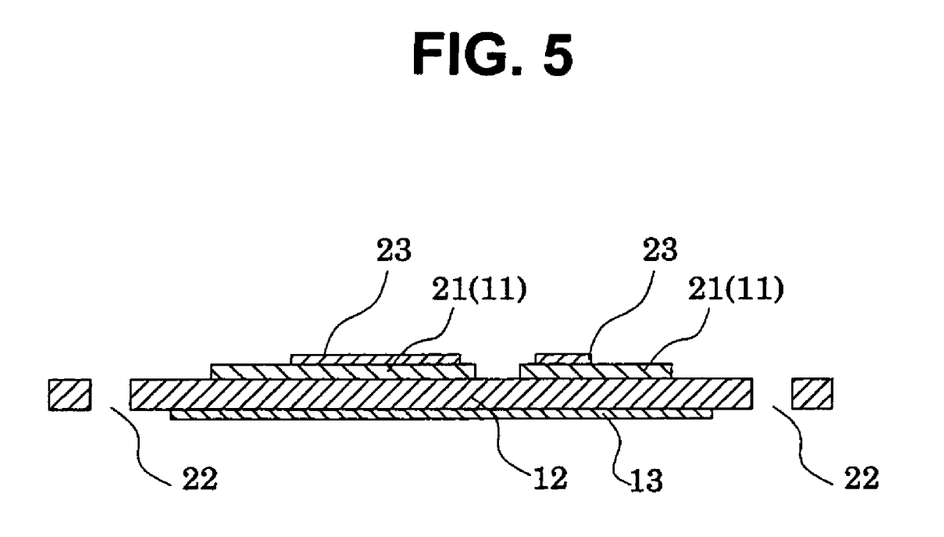
FIG. 5 is another cross-sectional view of the COF film carrier tape according to one embodiment of the invention.

No particular limitation is imposed on the method for forming such a releasing layer, and any known method can be employed. For example, a releasing agent or a liquid thereof may be applied to a substrate through spraying, dipping, or roller-coating. Alternatively, a releasing layer provided on a transfer film may be transferred. In any case, bonding between the insulating layer and the releasing layer may be enhanced through, for example, heat treatment in order to prevent peeling of the releasing layer from the insulating layer. The releasing layer is not necessarily provided uniformly on the entire insulating layer, and may be provided in the form of discontinuous islands. For example, in case the releasing layer is provided by transferring, in case the releasing layer may be provided on only the region between two rows of sprocket holes (FIG. 5), which will be described later, or on the region corresponding to the region where semiconductor chips (IC) are to be mounted in a continued form or in the form of discontinuous islands. No particular limitation is imposed on the timing of provision of the releasing layer, so long as the layer is provided prior to mounting of semiconductor elements. Specifically, the releasing layer may be provided after provision of the conductor layer; provided in advance on an insulating layer which has not been provided with a conductor layer; or provided simultaneously with provision of the conductor layer. Needless to say, the releasing layer is not necessarily provided prior to patterning of the conductor layer, but may be provided after patterning of the conductor layer.

The transfer method is preferably employed in the cases in which, for example, the releasing layer is provided after provision of the conductor layer or in advance on an insulating layer which has not been provided with a conductor layer. When the releasing layer is provided after patterning of the conductor layer, the application method is preferably employed. Needless to say, the timing of formation of the releasing layer is not limited, and the layer may be provided at an initial stage before patterning of the conductor layer through application or may be provided after patterning of the conductor layer through transfer.

In one embodiment of the production method of the present invention, the releasing layer is provided after the photolithographic process (pattering process) and before mounting of semiconductor elements. The reason for choosing the above timing is that the releasing layer is possibly dissolved by a photoresist remover or a similar material. Therefore, the releasing layer is preferably provided after etching of the conductor layer for removal of a resist mask for forming a wiring pattern. Specifically, the releasing layer is preferably provided, for example, after formation of a tin plating layer preceded by removal of a resist mask or after plating of a lead electrode preceded by removal of the resist mask and provision of a solder resist layer. Such a releasing layer may be formed by coating a solution containing a releasing agent and bringing the applied solution to dryness. However, in order to enhance bonding strength between the insulating layer and the releasing layer, the applied solution is preferably heated. The conditions under which the heating is performed are, for example, at 50 to 200° C., preferably 100 to 200° C. for one minute to 120 minutes, preferably 30 minutes to 120 minutes.

According to another embodiment of the method of the present invention, a releasing layer provided on a transfer film may be transferred on a surface of the insulating layer, which surface is opposite to the mounting side of the semiconductor chips (IC). Exemplary conditions under which the transfer is performed are, but are not limited to, a heating temperature of 15 to 200° C., a load for rolling or pressing of 5 to 50 kg/cm$^2$, and a treatment time of 0.1 seconds to two hours. Bonding between the insulating layer and the releasing layer may be enhanced through, for example, heat treatment in order to prevent peeling of the releasing layer from the insulating layer. Exemplary conditions under which the heating is performed are, but are not limited to, at 50 to 200° C., preferably 100 to 200° C., preferably for one minute to 120 minutes, preferably 30 minutes to 120 minutes.

According to the above transfer method, no particular limitation is imposed on the timing of provision of the releasing layer, so long as the layer is provided prior to mounting of semiconductor elements. Specifically, the releasing layer may be provided in advance on an insulating layer which has not been provided with a conductor layer; or provided simultaneously with provision of the conductor layer. Needless to say, the releasing layer is, not necessarily provided prior to patterning of the conductor layer, but may be provided after patterning of the conductor layer.

The transfer method is preferably employed in the cases in which, for example, the releasing layer is provided in advance on an insulating layer which has not been provided with a conductor layer. In the case in which the releasing layer is provided through the transfer method at an initial stage of production of the COF flexible printed wiring board, the following procedure may be employed. Specifically, the film substrate is not peeled from the releasing layer, so as to serve as a reinforcing film, and the film substrate is removed at a final production step.

In use of the COF flexible printed wiring board of the present invention, a semiconductor chip is mounted thereon. No particular limitation is imposed on the mounting method. For example, semiconductor chips are mounted by positioning and disposing the COF flexible printed wiring board on semiconductor chips which are placed on a chip stage, and pressing a heating tool against the COF flexible printed wiring board. In this case, the heating tool is heated to at least 200° C., or in some cases, 350° C. or higher. However, since the COF flexible printed wiring board has a releasing layer formed on the insulating layer, melt adhesion between the heating tool and the insulating layer can be prevented.

Hereafter, a COF film carrier tape, which is one embodiment of the COF flexible printed wiring board of the present invention, will be described with reference to FIGS. 1A and 1B. The following embodiments of the present invention will be described taking a COF film carrier tape as an example. However, needless to say, those with ordinary skill in the art would readily understand that COF FPCs can also be realized in an analogous manner.

Figure 1A:
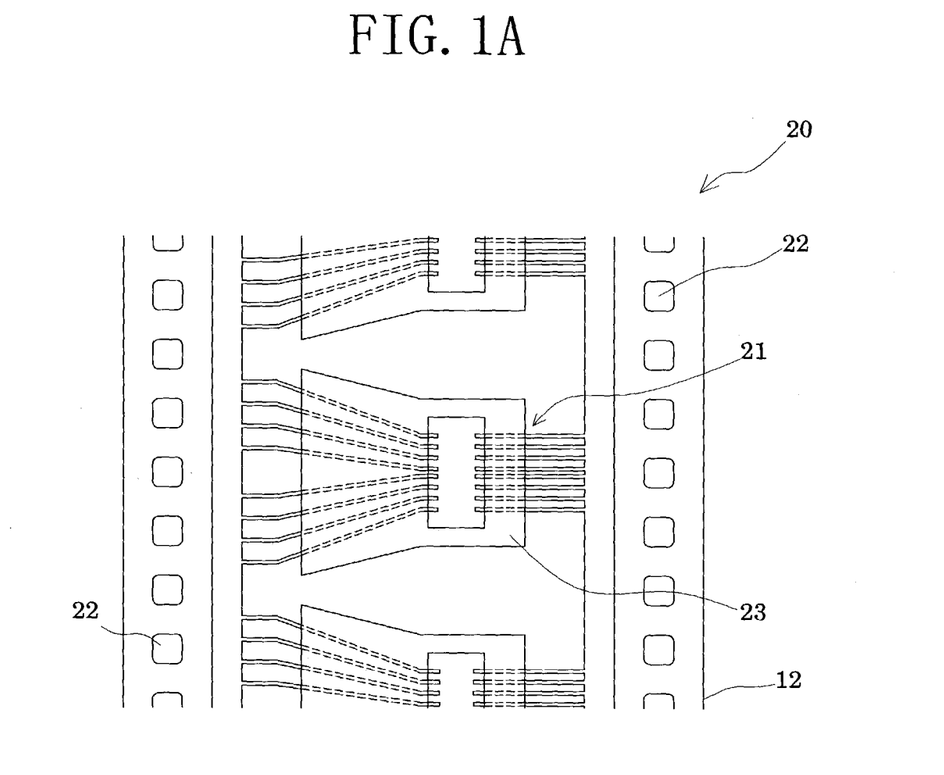
FIG. 1A is a schematic plan view of a COF film carrier tape according to one embodiment of the present invention.
Figure 1B:
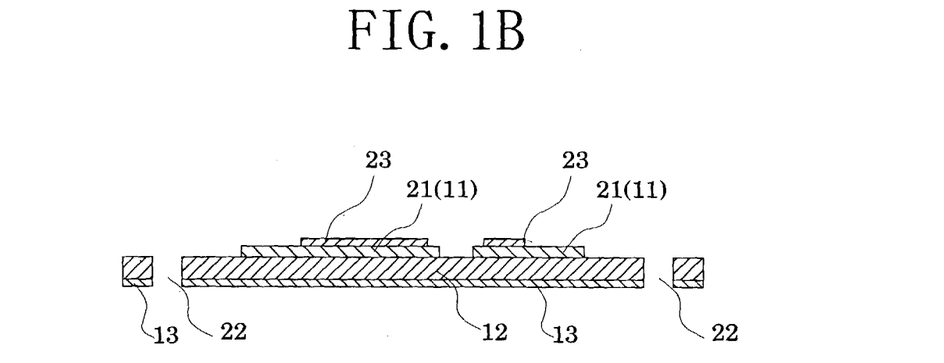
FIG. 1B is a cross-sectional view of the COF film carrier tape according to the same embodiment of the present invention.

FIGS. 1A and 1B show a COF film carrier tape 20 according to one embodiment of the present invention.

As shown in FIGS. 1A and 1B, the COF film carrier tape 20 according to the present embodiment is formed from a laminate film 10 for producing a COF, the laminate film comprising a conductor layer 11 (copper foil) and an insulating layer 12 (polyimide film). The COF film carrier tape 20 has wiring patterns 21 obtained by patterning the conductor layer 11, and a pair of transversely spaced rows of sprocket holes 22 provided along opposite longitudinal edges; this is, the two rows of sprocket holes 22 are disposed such that one row extends along each of the opposite longitudinal edges of the wiring pattern 21. The wiring patterns 21 are provided on a surface of the insulating layer 12 continuously in the longitudinal direction of the film carrier tape. Each wiring pattern 21 has, on a surface thereof, a solder resist layer 23 which is formed by coating a solder resist coating solution through screen printing. Moreover, the wiring pattern may be formed on two sides of the insulating layer (2-metal COF film carrier tape). In this case, the releasing layer may be formed on only the region where the heating tool is to contact, by coating or transferring.

Although the conductor layer 11 can be formed from a metal other than copper; e.g., aluminum, gold or silver, a copper layer is generally employed. No particular limitation is imposed on the type of copper layer, and any type of copper layers, such as a copper layer formed through vapor deposition or plating, electrolyzed copper foil, or rolled copper foil, can be used. Generally, the conductor layer 11 has a thickness of 1 to 70 µm, preferably 5 to 35 µm.

The insulating layer 12 may be formed from, other than polyimide, a polymeric material such as polyester, polyamide, polyether-sulfone, or liquid crystalline polymer. Of these, an aromatic polyimide (all repeating units being aromatic) prepared by polymerizing pyromellitic dianhydride and 4,4'-diaminodiphenyl ether is preferred. The thickness of the insulating layer 12 generally falls within a range of 12.5 to 125 µm, preferably 12.5 to 75 µm, more preferably 12.5 to 50 µm.

The laminate film 10 for producing a COF is produced by, for example, coating to a conductor layer 11 (copper foil) a polyimide precursor resin composition containing a polyimide precursor and varnish, to thereby form a coating layer 12a; removing the solvent by drying; winding the coating layer; and heating the wound coating layer in an oxygen-purged curing furnace for imidization, to thereby form the insulating layer 12. However, no particular limitation is imposed on the method for producing the laminate film.

A releasing layer 13 can be formed from a silicone series releasing agent containing a silazane compound or a releasing agent containing silica sol. Preferably, the releasing layer 13 is formed by providing a releasing agent on the insulating layer 12 through, for example, the application method, followed by heating to thereby attain strong bonding between the releasing layer 13 and the insulating layer 12. The releasing layer 13 has a thickness of, for example, 0.1 to 1 µm.

On the above-described COF film carrier tape of the present invention, chips or electronic devices are mounted. For example, while the tape or substrate is conveyed, semiconductor chips are mounted on the tape, or electronic devices are mounted on a print substrate, to thereby yield COF products. Since the insulating layer 12 has a optical transmittance of 50% or higher, the image of the wiring patterns 21 (e.g. an inner lead) can be recognized from the side of the insulating layer 12 by means of a CCD or a similar device. In addition, the wiring patterns of semiconductor chips and printed circuit boards to be mounted can be recognized. Thus, precise positioning of the wiring patterns with respect to the insulating layer 12 can be performed through image processing, thereby mounting electronic devices at high precision.

Next, one exemplary method of producing the aforementioned COF film carrier tape will be described with reference to FIGS. 2A to 2G.

Figure 2A:
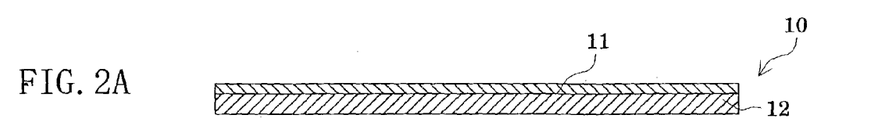
FIGS. 2A to 2G are cross-sectional views showing a method of producing a COF film carrier tape according to one embodiment of the present invention.
Figure 2B:
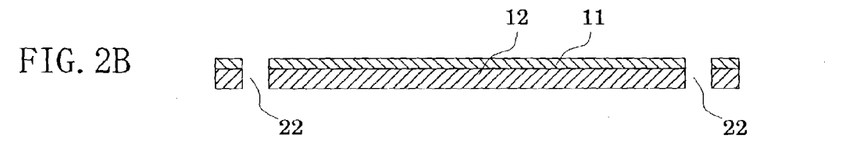
Figure 2C:
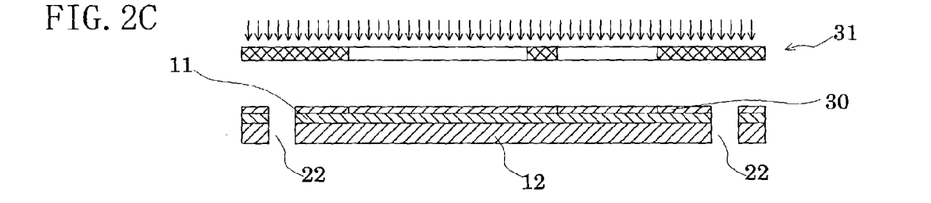
Figure 2D:
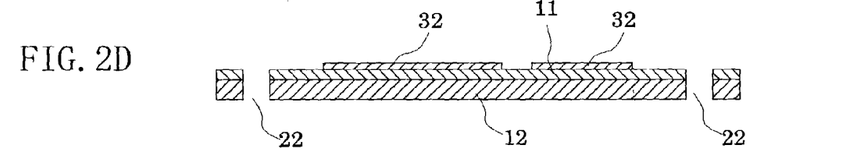
Figure 2E:
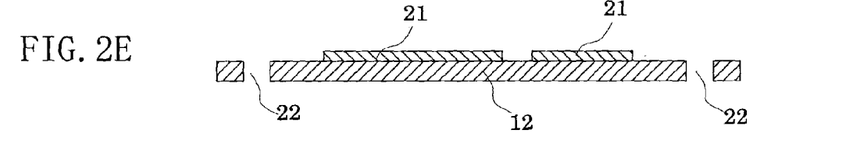

As shown in FIG. 2A, a laminate film 10 for producing a COF is provided. As shown in FIG. 2B, sprocket holes 22 are formed, by punching or a similar method, through a conductor layer 11 and an insulating layer 12. These sprocket holes 22 may be formed from the front side or the backside of the insulating layer 12. Then, as shown in FIG. 2C, a photoresist coating layer 30 is formed on a region of the conductor layer 11 for providing a wiring pattern 21, through a routine photolithographic method involving application of, for example, a negative type photoresist coating solution. Needless to say, a positive type photoresist can also be employed. After the insulating layer 12 is positioned by inserting positioning pins in the sprocket hole 22, the photoresist coating layer 30 is exposed and developed via a photomask 31 for patterning thereof, thereby forming a resist pattern 32 for providing a wiring pattern as shown in FIG. 2D. Subsequently, the conductor layer 11 is removed by dissolving with an etchant through the resist pattern 32 serving as a mask pattern, and the resist pattern 32 is removed by dissolving with an alkaline solution or a similar material, thereby forming a wiring pattern 21 as shown in FIG. 2E.

Here, when the wiring pattern 21 is formed, a dummy wiring pattern, which is formed discontinuous with the wiring pattern 21, may be formed in such a manner that the sprocket holes 22 are surrounded. In this case, the dummy wiring pattern could reinforce the insulator layer 12, thereby enable to carry the insulator layer 12 certainly and well, when the COF film carrier tape are manufactured. The dummy wiring pattern may be formed continuously along longitudinal direction of the insulator layer 12. The dummy wiring pattern may also be formed around each of sprocket holes 22 discontinuously, thereby improving rigidity of the insulator layer 12 in a manner which could be carried certainly.

Figure 2F:
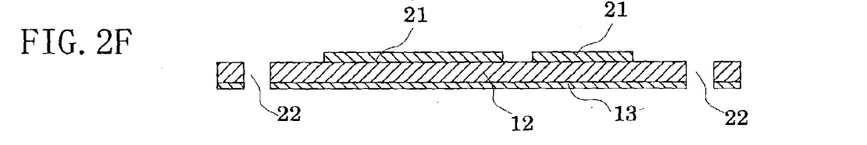
Figure 2G:
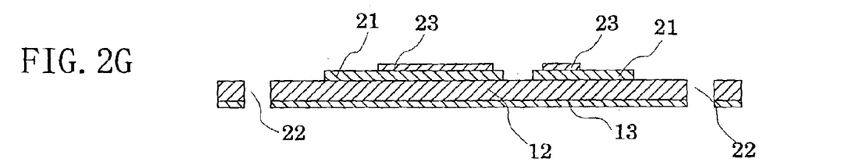

The entirety of the thus-formed wiring pattern 21 is plated (e.g., plated with tin) in accordance with needs, and then a releasing layer 13 is formed, through the application method, on the insulating layer 12, as shown in FIG. 2F. Although the applied releasing layer 13 may be simply dried, heating of the layer is preferred, for enhancing a releasing effect; i.e., for preventing melt adhesion of a heating tool and the insulating layer. Exemplary conditions under which the heating is performed are, but are not limited to, at 50 to 200° C., preferably 100 to 200° C. for one minute to 120 minutes, preferably 30 minutes to 120 minutes. Subsequently, a solder resist layer 23 is formed through, for example, screen printing, as shown in FIG. 2G. An outer lead and an inner lead, which are not covered with the solder resist layer 23, are plated with a metal in accordance with needs. No particular limitation is imposed on the material of the metal plating layer, and tin plating, tin alloy plating, nickel plating, gold plating, gold alloy plating, etc. may appropriately be performed in accordance with the purpose of use.

In the embodiment described above, the releasing layer 13 is formed after removal of the resist pattern 32 with an alkali solution or a similar material and before provision of the solder resist layer 23. Alternatively, the releasing layer 13 may be formed in the final production step after provision of the solder resist layer 23. When the releasing layer 13 is formed through the latter method, exposure of the releasing layer 13 to an etchant, a photoresist remover, etc. is prevented, thereby attaining a high releasing effect. As described hereinabove, the term "final production step" refers to as a step immediately before the product inspection step.

As described above, the releasing layer of the present invention is preferably formed after the photolithography step for forming wiring patterns 21 and before bonding with semiconductor chips. The reason for the timing is that the releasing layer is possibly dissolved in a photoresist layer removal step. Therefore, the releasing layer 13 is preferably formed immediately after completion of the photolithography step or after plating, more preferably after formation of the solder resist layer 23 or a similar step. Needless to say, the releasing layer 13 may also be formed before the photolithography step.

Figure 3A:
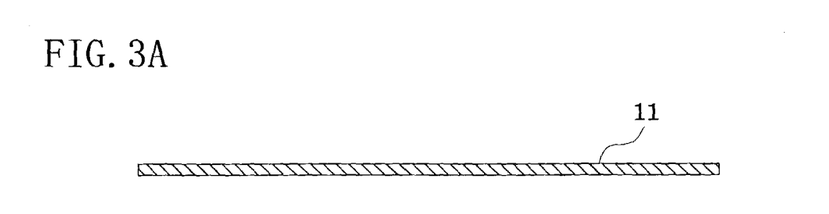
FIG. 3A to 3E are cross-sectional views showing a laminate film for producing a COF according to another embodiment of the present invention.
Figure 3B:
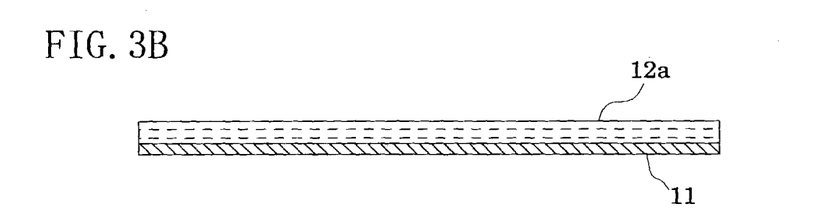
Figure 3C:
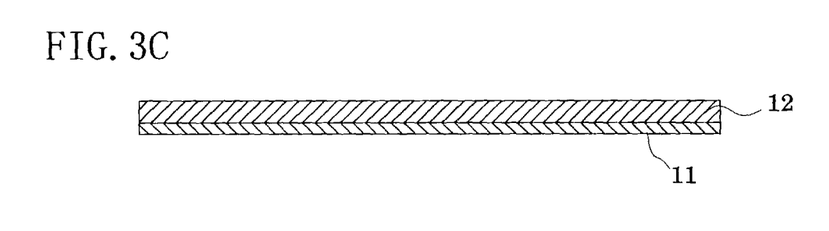
Figure 3D:
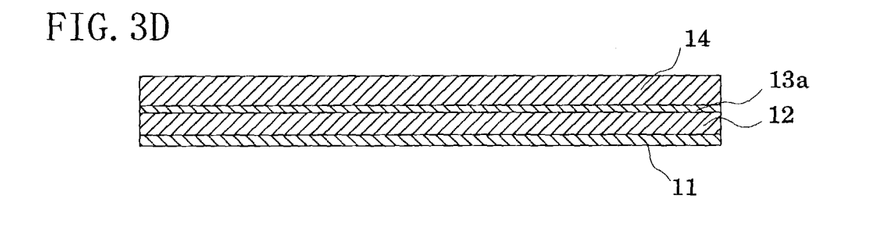
Figure 3E:
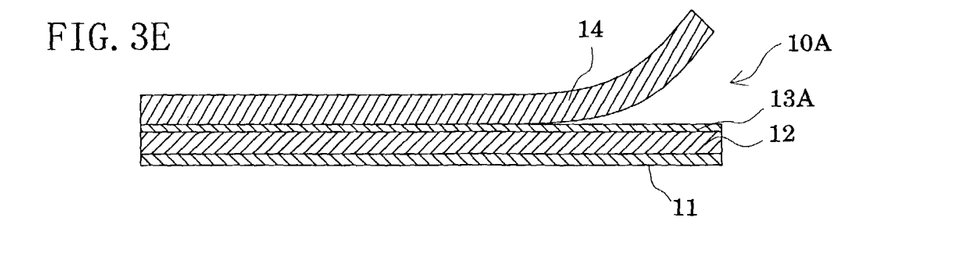

The releasing layer may be formed through the transfer method. Specifically, the aforementioned COF film carrier tape may be produced from a laminate film 10A for producing a COF as shown in FIGS. 3A to 3E. The laminate film shown in FIGS. 3A to 3E is produced by coating to a conductor layer 11 (copper foil, FIG. 3A) a polyimide precursor resin composition containing a polyimide precursor and varnish, to thereby form a coating layer 12a (FIG. 3B); removing the solvent by drying; winding the coating layer; and heating the wound coating layer in a curing furnace for imidization, to thereby form the insulating layer 12 (FIG. 3C). Subsequently, a releasing layer 13a formed on a transfer film 14 serving as a transfer substrate is brought into firm contact with the surface of the insulating layer 12 opposite to the side of the conductor layer 11 (FIG. 3D) and heated. Then, the transfer film 14 is peeled, thereby forming the laminate film 10A for producing a COF and having a releasing layer 13A (FIG. 3E). Exemplary conditions under which the transfer is performed are, but are not limited to, a heating temperature of 15 to 200° C., a load for rolling or pressing of 5 to 50 kg/cm$^2$, and a treatment time of 0.1 seconds to two hours. Exemplary conditions under which the heating is performed are, but not limited to, at 50 to 200° C., preferably 100 to 200° C. for one minute to 120 minutes, preferably 30 minutes to 120 minutes. Needless to say, formation of the releasing layer 13A through transfer may be performed after the photolithography step or a similar step. Examples of the material of the transfer film 14 include PET (polyethylene terephthalate), PI (polyimide), and liquid crystal polymers. The thickness of such transfer film 14 is, for example, 15 to 100 μm, preferably 20 to 75 μm.

Figure 4:
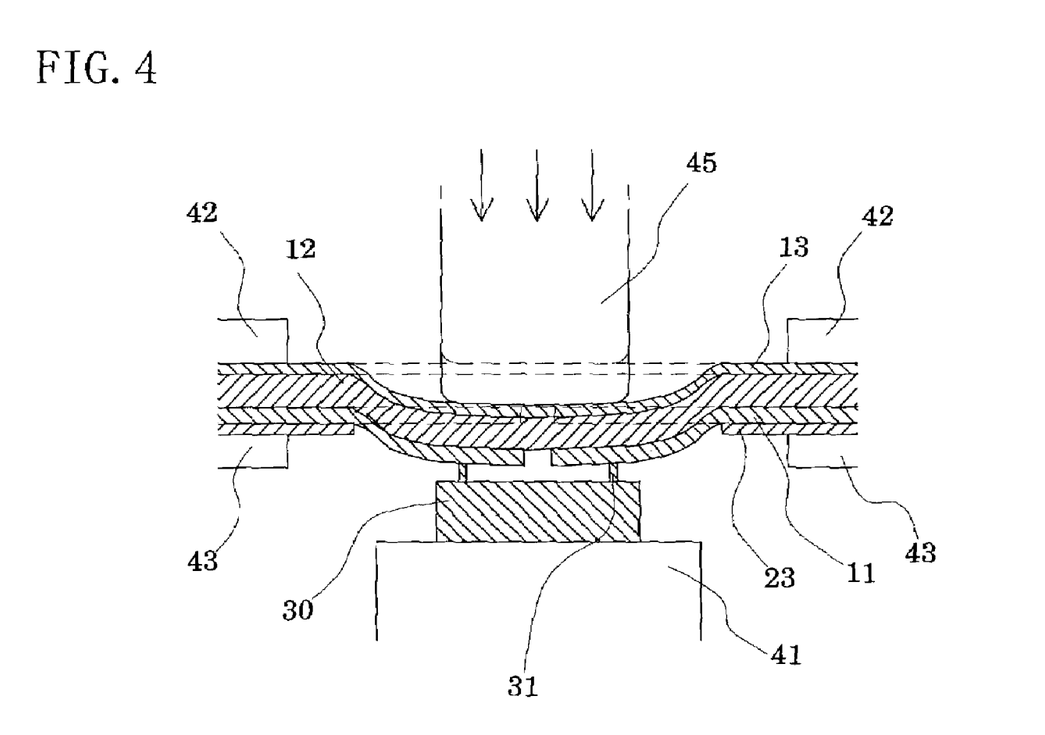
FIG. 4 is a cross-sectional view showing a method of producing a printed circuit board according to one embodiment of the present invention.

As shown in FIG. 4, the printed circuit board of the present invention is produced by mounting a semiconductor chip 30 on a COF film carrier tape 20 produced in the above-described manner. Specifically, the COF film carrier tape 20 is conveyed and then positioned at a predetermined position, while the semiconductor chip 30 is placed on a chip stage 41. Subsequently, the COF film carrier tape 20 is fixed by means of upper dampers 42 and lower dampers 43, with each upper clamper 42 descending while a corresponding lower damper 43 ascending. A heating tool 45 is pressed against the thus-fixed COF film carrier tape 20 so as to heat the tape, and further descends, thereby pressing an inner lead of the film carrier tape 20 against a bump 31 of the semiconductor chip 30. Pressing is performed for a predetermined period of time, thereby bonding the inner lead and the semiconductor chip 30. After completion of bonding, the bonded chip is sealed with resin, to thereby produce a printed circuit board.

Depending on time and pressure of pressing or other conditions, the temperature of the heating tool 45 is controlled to 200° C. or higher, preferably 350° C. or higher. According to the present invention, even when the heating tool 45 is heated to such high temperature, melt adhesion between the COF film carrier tape 20 and the heating tool 45 is prevented by virtue of a releasing layer 13 provided on a surface of the film carrier tape 20 to be brought into contact with the heating tool 45. Therefore, according to the present invention, bonding can be performed at sufficiently high temperature, thereby ensuring high bonding strength. In other words, since heating temperature can be elevated for attaining a predetermined level of bonding strength, the time required for press bonding can be shortened, which is advantageous.

EXAMPLES

Examples 1a to 1d

A variety of commercially available polyimide film substrates; i.e., S'PERFLEX (trade name: product of Sumitomo Metal Mining Co., Ltd.; Example 1a), ESPANEX (trade name: product of Nippon Steel Chemical Co., Ltd.; Example 1b), NEOFLEX (trade name: product of Mitsui Chemicals, Inc.; Example 1c), and UPISEL (trade name: product of Ube Industries, Ltd.; Example 1d) were used to provide laminate films for producing a COF. A conductor layer of each laminate film was patterned by use of a photoresist. The entirety of the resultant pattern was tin-plated, and a silicone series resin (containing a silane compound), SR2411 (trade name: product of Dow Corning Toray Silicone Co., Ltd.), was applied to the backside of the film substrate. The coating was heated at 125° C. for one hour, to thereby form a COF film carrier tape having a releasing layer.

Examples 2a to 2d

A variety of commercially available polyimide film substrates similar to those employed in Examples 1a to 1d; i.e., S'PERFLEX (trade name: product of Sumitomo Metal Mining Co., Ltd.; Example 2a), ESPANEX (trade name: product of Nippon Steel Chemical Co., Ltd.; Example 2b), NEOFLEX (trade name: product of Mitsui Chemicals, Inc.; Example 2c), and UPISEL (trade name: product of Ube Industries, Ltd.; Example 2d) were used to provide laminate films for producing a COF. A conductor layer of each laminate film was patterned by use of a photoresist. The entirety of the resultant pattern was tin-plated, and a silicone series resin (containing silazane), SEPA-COAT (trade name: product of Shin-Etsu Chemical Co., Ltd.), was applied to the backside of the film substrate. The coating was heated at 125° C. for one hour, to thereby form a COF film carrier tape having a releasing layer.

Comparative Examples 1a to 1d and 2a to 2d

The procedure of Examples 1a to 1d and 2a to 2d were repeated, except that no releasing layer was provided, to thereby yield COF film carrier tapes of Comparative Examples 1a to 1d and 2a to 2d, respectively.

Test Example 1

A heating tool was pressed against the releasing layer 13 of each of COF film carrier tapes produced in Examples 1a to 1d and 2a to 2d and Comparative Examples 1a to 1d and 2a to 2d. The temperature of the heating tool was varied within a range of 260° C. to 440° C. Under the heating conditions, semiconductor chips were mounted. Adhesion between the releasing layer and the heating tool was observed, and the temperature at which adhesion occurred was determined. The results are shown in Table 1.

TABLE 1

| | Releasing agent | Film substrate | Adhesion temperature (° C.) | |
|---|---|---|---|---|
| | | | Examples | Comp. Exs. |
| 1a | SR2411 | S'PERFLEX | 370 | 320 |
| 1b | SR2411 | ESPANEX | 360 | 320 |
| 1c | SR2411 | NEOFLEX | 360 | 340 |
| 1d | SR2411 | UPISEL | 350 | 260 |
| 2a | SEPA-COAT | S'PERFLEX | 440 | 320 |
| 2b | SEPA-COAT | ESPANEX | 390 | 320 |
| 2c | SEPA-COAT | NEOFLEX | 400 | 340 |
| 2d | SEPA-COAT | UPISEL | 360 | 260 |

As is clear from Table 1, the film carrier tapes of Examples 1a to 1d and 2a to 2d exhibit remarkably high adhesion resistance (i.e., high releasing effect), as compared with those of Comparative Examples 1a to 1d and 2a to 2d having no releasing layer 13.

Examples 3a to 3d

A variety of commercially available polyimide film substrates similar to those employed in Examples 1a to 1d; i.e., S'PERFLEX (trade name: product of Sumitomo Metal Mining Co., Ltd.; Example 3a), ESPANEX (trade name: product of Nippon Steel Chemical Co., Ltd.; Example 3b), NEOFLEX (trade name: product of Mitsui Chemicals, Inc.; Example 3c), and UPISEL (trade name: product of Ube Industries, Ltd.; Example 3d) were used to provide laminate films for producing a COF. A conductor layer of each laminate film was patterned by use of a photolithographic process, to thereby form a wiring pattern. The entirety of the wiring pattern was tin-plated, and subsequently a silicone series oil, SRX310 (trade name: product of Dow Corning Toray Silicone Co., Ltd.), was applied to the backside of the film substrate. The coating was heated at 125° C. for one hour, to thereby form a COF film carrier tape having a releasing layer.

Comparative Examples 3a to 3d

The procedure of Examples 3a to 3d were repeated, except that no releasing layer was provided, to thereby yield COF film carrier tapes of Comparative Examples 3a to 3d, respectively.

Test Example 2

A heating tool was pressed against the releasing layer 13 of each of COF film carrier tapes produced in Examples 3a to 3d and Comparative Examples 3a to 3d. The temperature of the heating tool was varied within a range of 260° C. to 400° C. Under the heating conditions, semiconductor chips were mounted. Adhesion between the releasing layer and the heating tool was observed, and the temperature at which adhesion occurred was determined. The results are shown in Table 2.

TABLE 2

| | Adhesion temperature (° C.) | |
|---|---|---|
| | Examples | Comp. Exs. |
| 3a: S'PERFLEX | 400 | 320 |
| 3b: ESPANEX | 350 | 320 |
| 3c: NEOFLEX | 370 | 340 |
| 3d: UPISEL | 280 | 260 |

As is clear from Table 2, the film carrier tapes of Examples 3a to 3c exhibit remarkably high adhesion resistance as compared with those of Comparative Examples 3a to 3c. Although the film carrier tape of Example 3d exhibits an adhesion temperature higher than that of the film carrier tape of Comparative Example 3d, the difference in temperature was comparatively small. However, in view that the temperature at which semiconductor elements are mounted through melt adhesion varies depending on the type of heating tools, the type of semiconductor chips, use of the element-mounted products, etc., and is generally about 200° C. to about 350° C., such a small increase in adhesion temperature would suffice for purposes of the present invention.

Examples 4a to 4h

The procedure of Example 1a was repeated, except that the timing of application of SEPA-COAT (trade name: product of Shin-Etsu Chemical Co., Ltd.) was varied, to thereby produce COF film carrier tapes. Specifically, the releasing layer was obtained by coating SEPA-COAT to a laminate film for producing a COF, followed by air-drying for three hours or longer (Example 4a); by heating the applied SEPA-COAT at 125° C. for one hour instead of air-drying (Example 4b); by coating SEPA-COAT at a cleaning step performed before patterning of the conductor layer, followed by air-drying for three hours or longer (Example 4c); by heating the thus-applied SEPA-COAT at 125° C. for one hour instead of air-drying (Example 4d); by coating SEPA-COAT after development of a photoresist for patterning the conductor layer, followed by air-drying for three hours or longer (Example 4e); by heating the thus-applied SEPA-COAT at 125° C. for one hour instead of air-drying (Example 4f); by coating SEPA-COAT after patterning of the conductor layer, removal of photoresist, and plating of tin, followed by air-drying for three hours or longer (Example 4g); or by heating the thus-applied SEPA-COAT at 125° C. for one hour instead of air-drying (Example 4h)

Test Example 3

A heating tool was pressed against the releasing layer 13 of each of COF film carrier tapes produced in Examples 4a to 4h. The temperature of the heating tool was varied within a range of 340° C. to 490° C. Under the heating conditions, semiconductor chips were mounted. Adhesion between the releasing layer and the heating tool was observed, and the temperature at which adhesion occurred was determined. The results are shown in Table 3.

TABLE 3

|  | Adhesion temperature (° C.) |
|---|---|
| Example 4a | 350 |
| Example 4b | 360 |
| Example 4c | 350 |
| Example 4d | 370 |
| Example 4e | 340 |
| Example 4f | 380 |
| Example 4g | 480 |
| Example 4h | 490 |

As is clear from Table 3, the film carrier tapes of Examples 4g and 4h, in which the releasing layer is formed after removal of photoresist, exhibit excellent adhesion resistance. A possible reason for excellent adhesion resistance is that the releasing layer is partially dissolved upon removal of photoresist performed after the photolithography step. As is also clear from the results, in the case in which the releasing layer is provided through the application method, adhesion resistance is further enhanced by heat treatment, as compared with air-drying without any additional heat treatment.

Examples 5a to 5e

In a manner similar to that for producing the film carrier tapes of Examples 4a to 4h, patterning of the conductor layer, removal of photoresist, plating with tin, and application of a silicone series resin were performed, to thereby produce film carrier tapes. Formation of the releasing layer was performed by air-drying three hours or longer or heating for one hour at 125° C. In Examples 5a to 5e, the silicone series resin, SEPA-COAT (trade name: product of Shin-Etsu Chemical Co., Ltd.), was diluted with ethyl acetate at a variety of dilution factors: i.e., 1 (undiluted), 2, 3, 5, and 10 times. In each case, the thickness of the releasing layer was calculated.

Test Example 4

A heating tool was pressed against the releasing layer 13 of each of COF film carrier tapes produced in Examples 5a to 5e. The temperature of the heating tool was varied within a range of 320° C. to 460° C. Under the heating conditions, semiconductor chips were mounted. Adhesion between the releasing layer and the heating tool was observed, and the temperature at which adhesion occurred was determined. The results are shown in Table 4.

TABLE 4

|  | Layer thickness (μm) | Adhesion temperature (° C.) | |
|---|---|---|---|
|  |  | Non-heated | Heated |
| Example 5a | 0.35 | 440 | 460 |
| Example 5b | 0.18 | 440 | 440 |
| Example 5c | 0.12 | 400 | 410 |
| Example 5d | 0.07 | 370 | 390 |
| Example 5e | 0.04 | 320 | 320 |

As is clear from Table 4, the film carrier tapes having a releasing layer thickness 0.05 μm or more exhibit adhesion resistance. As confirmed with Examples 5a to 5c, the film carrier tapes having a releasing layer thickness in excess of 0.1 μm exhibit remarkably high adhesion resistance.

Example 6

A polyimide layer (thickness: 40 μm) serving as an insulating layer 12 was formed through the application method on copper foil (thickness: 9 μm) of ultra-minute roughness serving as a conductor 11. On the other surface (opposite to the conductor 11) of the copper foil, a releasing layer 13 (thickness: 0.1 μm) formed of a silicone series compound was provided through the transfer method, thereby yielding a COF film carrier tape of Example 6. After completion of transferring of the releasing layer 13 formed from the silicone series compound, the film carrier tape was heated at 120° C.

Example 7

The procedure of Example 6 was repeated, except that heating treatment to be performed after transfer of the silicone series releasing agent was omitted, to thereby yield a laminate film for producing a COF of Example 7.

Example 8

The procedure of Example 6 was repeated, except that the silicone series compound the releasing layer 13 formed through transfer method was changed to formed from SEPA-COAT (trade name: product of Shin-Etsu Chemical Co., Ltd.), to thereby yield a laminate film for producing a COF of Example 8.

Comparative Example 4

The procedure of Example 6 was repeated, except that provision of the releasing layer 13 was omitted, to thereby yield a laminate film for producing a COF of Comparative Example 4.

Test Example 5

The conductor 11 of each of COF film carrier tapes of Examples 6 to 8 and Comparative Example 4 was patterned. A heating tool was pressed against the releasing layer 13 of each film carrier tape. The temperature of the heating tool was varied within a range of 260° C. to 440° C. Under the heating conditions, semiconductor chips were mounted. Adhesion between the releasing layer and the heating tool was observed, and the temperature at which adhesion occurred was determined. The results are shown in Table 5.

TABLE 5

| Tool temperature (° C.) | Example 6 | Example 7 | Example 8 | Comparative Example 4 |
|---|---|---|---|---|
| 260 | ○ | ○ | ○ | ○ |
| 280 | ○ | ○ | ○ | ○ |
| 300 | ○ | ○ | ○ | x |
| 320 | ○ | Δ | ○ | x |
| 340 | ○ | Δ | ○ | x |
| 360 | ○ | x | ○ | x |
| 380 | ○ | x | ○ | x |
| 400 | ○ | x | ○ | x |
| 420 | x | x | ○ | x |
| 440 | x | x | x | x |

○: no adhesion,
Δ: partially adhered,
x: adhered

As is clear from Table 5, the film carrier tape of Comparative Example 4 adheres to the heating tool when the temperature exceeds 300° C. The film carrier tape of Example 7 exhibits such an excellent adhesion resistance that the tape partially adheres to the heating tool when the temperature exceeds 320° C. The film carrier tapes of Examples 6 and 8 cause no adhesion when the temperature is 400° C. or lower. Although the film carrier tape of Example 7 exhibits an adhesion temperature higher than that of the film carrier tape of Comparative Example 4, the difference in temperature was comparatively small. However, in view that the temperature at which semiconductor elements are mounted through melt adhesion varies depending on the type of heating tools, the type of semiconductor chips, use of the element-mounted products, etc., and is generally about 200° C. to about 350° C. such a small increase in adhesion temperature would suffice for purposes of the present invention.

Examples 9a to 9c

S'PERFLEX (trade name: product of Sumitomo Metal Mining Co., Ltd.) was employed as a film substrate, and, as a releasing agent, COLCOAT P (trade name: product of Colcoat Co., Ltd., silica sol-containing; Example 9a); COLCOAT N-103X (trade name: product of Colcoat Co., Ltd.; Example 9b); and COLCOAT SP-2014S (trade name: product of Colcoat Co., Ltd., containing silane compound; Example 9c) were used. The entirety of the provided wiring pattern was tin-plated, and subsequently, each releasing agent was applied to the backside of the film substrate. The coating was dried by heating at 120° C. for 60 minutes, to thereby form a COF film carrier tape having a releasing layer.

A heating tool was pressed against the releasing layer 13 of each of COF film carrier tapes produced in Examples 9a to 9c. The temperature of the heating tool was varied within a range of 440° C. to 480° C. Under the heating conditions, semiconductor chips were mounted, to thereby produce a printed circuit board.

During production of printed circuit boards of Examples 9a to 9c, adhesion between the releasing layer and the heating tool was observed, and the temperature at which adhesion occurred was determined. The results are shown in Table 6.

TABLE 6

| Examples | Adhesion temperature (° C.) |
| --- | --- |
| 9a: COLCOAT P | 460 |
| 9b: COLCOAT N-103X | 480 |
| 9c: COLCOAT SP-2014S | 440 |

As is clear from Table 6, the film carrier tapes of Examples 9a to 9c also exhibit remarkably high adhesion resistance.

What is claimed is:

1. A COF flexible printed wiring board comprising:
   an insulating layer;
   a wiring pattern, on which a semiconductor chip is to be mounted, formed of a conductor layer provided on at least one side of the insulating layer;
   two rows of sprocket holes provided along longitudinal regions on both sides of the wiring pattern, such that one row of sprocket holes extends along each of the opposite longitudinal edges of the wiring pattern; and
   a releasing layer, wherein the releasing layer is formed from a releasing agent containing at least one species selected from a silane compound and silica sol and the releasing layer is provided on a surface of the insulating layer only between the rows of sprocket holes, wherein said surface is opposite to the mounting side of the semiconductor chip, so as to correspond to the semiconductor chip mounting area.

2. A COF flexible printed wiring board according to claim 1, wherein the releasing layer is formed from a releasing agent containing a silazane compound.

3. A COF flexible printed wiring board according to claim 1, wherein the releasing layer is formed by coating a solution containing the releasing agent to the insulating layer and heating.

4. A COF flexible printed wiring board according to claim 1, wherein the releasing layer is formed by bringing a transfer film substrate, having the releasing layer formed thereon, into firm contact with the surface of the insulating layer.

5. A COF flexible printed wiring board according to any one of claims 1 to 4, wherein the insulating layer is formed by coating a solution containing a polyimide precursor resin on to the conductor layer, drying the solution, and curing the resin.

6. A COF flexible printed wiring board according to any one of claims 1 to 4, wherein the insulating layer comprises a layer structure including an insulating film and a thermoplastic resin layer, wherein the structure is hot-press-adhered to the conductor layer.

7. A COF flexible printed wiring board according to any one of claims 1 to 4, wherein the insulating layer comprises a layer structure including an insulating film and a thermosetting resin layer, wherein the structure is hot-press-adhered to the conductor layer.

8. A COF flexible printed wiring board according to any one of claims 1 to 4, wherein the conductor layer comprises a bond-improving layer sputtered on the insulating layer, and a copper plating layer provided on the bond-improving layer.

9. A COF flexible wiring board according to claim 1, wherein the releasing layer is provided after formation of the wiring pattern through photolithography.

* * * * *